United States Patent
Kawakami et al.

(10) Patent No.: US 8,585,112 B2
(45) Date of Patent: Nov. 19, 2013

(54) SAMPLE CONVEYING MECHANISM

(75) Inventors: Katsuya Kawakami, Mito (JP);
Masahiro Tsunoda, Hitachinaka (JP);
Takashi Gunji, Mito (JP); Hidetoshi Sato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 292 days.

(21) Appl. No.: 13/057,602

(22) PCT Filed: Jul. 29, 2009

(86) PCT No.: PCT/JP2009/063836
§ 371 (c)(1),
(2), (4) Date: Feb. 25, 2011

(87) PCT Pub. No.: WO2010/016505
PCT Pub. Date: Feb. 11, 2010

(65) Prior Publication Data
US 2011/0142578 A1  Jun. 16, 2011

(30) Foreign Application Priority Data
Aug. 6, 2008  (JP) ................. 2008-202602

(51) Int. Cl.
*B25J 15/10* (2006.01)
*H01L 21/677* (2006.01)

(52) U.S. Cl.
USPC ......... 294/119.1; 294/213; 294/902; 414/941

(58) Field of Classification Search
USPC ............. 294/103.1, 119.1, 213, 902; 414/941
See application file for complete search history.

(56) References Cited

U.S. PATENT DOCUMENTS

| | | | | |
|---|---|---|---|---|
| 4,479,673 A * | 10/1984 | Inaba et al. | .................... | 294/207 |
| 4,999,671 A | 3/1991 | Iizuka | | |
| 5,100,502 A * | 3/1992 | Murdoch et al. | ........... | 414/744.1 |
| 5,106,138 A * | 4/1992 | Lawson | ............................ | 294/2 |
| 5,885,051 A * | 3/1999 | Azuma et al. | ............... | 414/744.4 |
| 6,507,474 B1 | 1/2003 | Singh et al. | | |
| 6,909,276 B2 * | 6/2005 | Hofer et al. | ............... | 324/750.22 |
| 8,322,766 B1 * | 12/2012 | Hsiung et al. | .................. | 294/213 |
| 2004/0113444 A1* | 6/2004 | Blonigan et al. | ................ | 294/1.1 |
| 2005/0173446 A1* | 8/2005 | Han et al. | ......................... | 221/15 |

FOREIGN PATENT DOCUMENTS

| | | |
|---|---|---|
| JP | 63-022427 A | 1/1988 |
| JP | 6-329252 A | 11/1994 |
| JP | 10-233434 A | 9/1998 |
| JP | 10-264071 A | 10/1998 |
| JP | 2003-100844 A | 4/2003 |
| JP | 2005-091862 A | 4/2005 |
| JP | 2005-183549 A | 7/2005 |
| WO | WO-2004/059724 A1 | 7/2004 |
| WO | WO 2010/016505 A1 | 2/2010 |

* cited by examiner

*Primary Examiner* — Dean Kramer
(74) *Attorney, Agent, or Firm* — Miles & Stockbridge P.C.

(57) ABSTRACT

A sample conveying mechanism minimizes a risk of damage to a sample typified particularly by a photomask, and the sample conveying mechanism provides the sample retention mechanism for holding the sample so as to be suspended and is configured such that a portion close to a pattern surface of the sample is separated from a projection section of a flange for suspending the sample, thereby inhibiting a contact between the pattern surface and members configuring the conveying mechanism.

9 Claims, 10 Drawing Sheets

SAMPLE CONVEYING MECHANISM

TECHNICAL FIELD

The present invention relates to a sample conveying mechanism for use in a charged particle beam device etc., and in particular to a preferred sample conveying mechanism for conveying a photomask.

BACKGROUND ART

Among the charged particle beam devices typified by a scanning electron microscope (SEM), a device used for a measurement and inspection of semiconductor devices often uses a conveying robot for conveying a sample taken out from a sample cassette, such as a SMIP pod for holding plural samples, as far as a load lock chamber via a device called a mini-environment for forming an air cleaning space. The load lock chamber is used for performing a preliminary evacuation from an atmospheric environment so that the sample is introduced into a sample chamber maintaining a vacuum in the SEM.

The conveying robot includes types such that the sample is supported from below thereof (Patent Literature 1), the sample is conveyed with it absorbed by an electrostatic absorption etc. (Patent Literature 1), and the sample is held from its sides thereof as a mechanism (Patent Literature 2).

CITATION LIST

Patent Literature

Patent Literature 1: JP-A-10-233434
Patent Literature 2: JP-A-2005-183549

SUMMARY OF INVENTION

Technical Problem

In the case of a sample retention mechanism operated by the electrostatic absorption described in the Patent Literature 1 and the mechanism for holding the sample described in the Patent Literature 2, it is apprehended that there arises a problem caused by a sample deformation and deflection since the sample is subjected to a mechanical motion caused by a pressing force and aspiration. Particularly, in the mechanism for holding the sample from lateral sides described in the Patent Literature 2, it is apprehended that there is a possibility to impart a damage to a sample surface by a contacted portion with the sample in the mechanism. Particularly, the photomask in the semiconductor device forms a light shield pattern made up of a chromium film corresponding to a circuit design pattern on a quartz sample, therefore, when such pattern is contacted to the mechanism for holding the sample, there is a possibility that the damage is reached on the light shield pattern.

Particularly, when the sample is intended to be held in a condition where the photomask is loaded obliquely (abnormal seating) caused by some sort of an external influence etc., a risk of contact between the surface of sample and a holding mechanism increases. Further, the holding mechanism only contacts to an upper or lower portion (corner portion), among the side portions of photomask, to increase a pressing force per unit area for the photomask and increase the risk of sample damage.

Hereinafter, a description will be concerned with a sample conveying mechanism and a charged particle beam device using the same for an object of minimizing the damage risk of sample typified particularly by the photomask.

Solution to Problem

As an aspect of achieving the above-mentioned object, the sample conveying mechanism providing the sample retention mechanism for holding the sample so as to be suspended, is configured such that a portion (arm section for holding suspending sections respectively providing projection sections, or the suspending sections positioned at a pattern surface side far from the arm section and projection section) close to a pattern surface of the sample is separated from a projection section of a flange etc. for suspending the sample. Such a suspending structure does not impart a mechanical load to the sample, and since the portion close to the pattern surface in the sample conveying mechanism is formed separated from the sample with respect to the projection portion, even in a condition of the abnormal seating, it is possible to inhibit the contact risk between the pattern surface and members configuring the conveying mechanism.

Advantageous Effects of Invention

According to the above-mentioned configuration, it is possible to provide the sample conveying mechanism capable of minimizing a risk of damage to the sample on the conveying of sample, even in the case where the sample is loaded obliquely.

DESCRIPTION OF EMBODIMENTS

Hereinafter, an outline of a sample conveying mechanism for use in a semiconductor measurement and inspection device will be described. In addition, in the following description, a critical dimension scanning electron microscope (Critical Dimension-SEM: CD-SEM) will be described as an example for one semiconductor measuring device. However, this is not limited thereto. For example, a defect reviewing SEM (Defect Review-SEM: DR-SEM) etc. can also be used for reviewing a defect on the basis of a coordinate information of the defect. In addition, among CD-SEMs, the CD-SEM set a photomask to a measuring target, used in a semiconductor optical exposure device, will be described in the following description.

Figure 1:
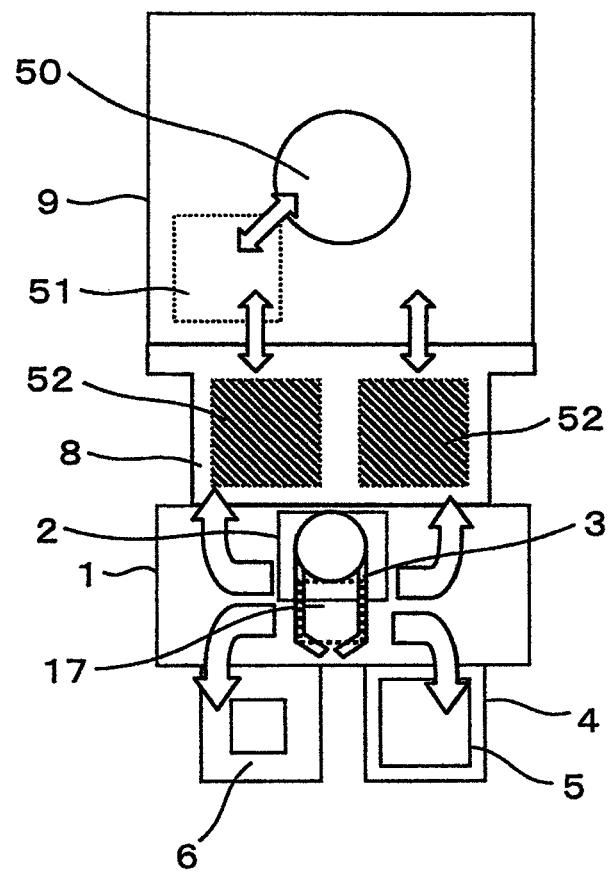
FIG. 1 is a view showing an outline of CD-SEM (top view).
Figure 2:
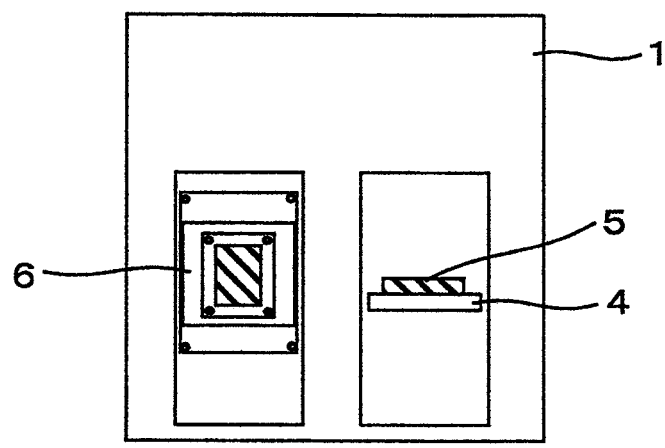
FIG. 2 is a view showing an outline of CD-SEM seen from a load port side.
Figure 3:
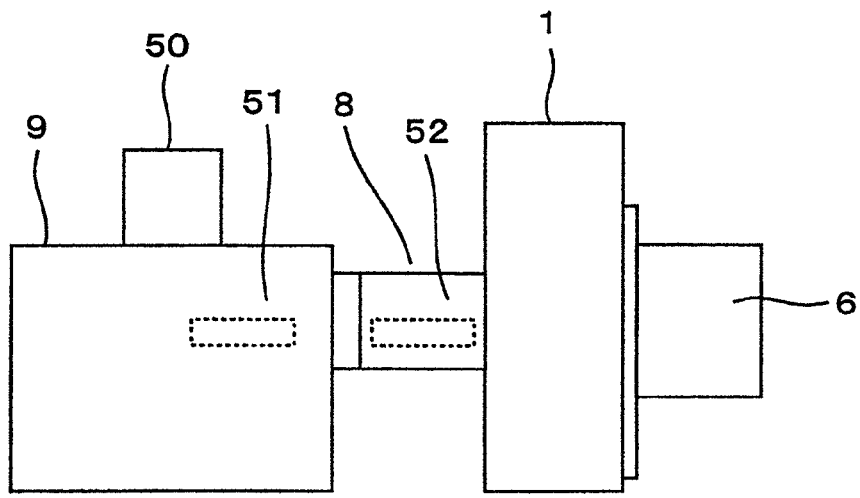
FIG. 3 is a view showing an outline of CD-SEM (side view).

FIG. 1 to FIG. 3 are views for explaining an outline of the CD-SEM. The CD-SEM is divided and configured largely by a sample transport mechanism of mini-environment type 1, a load lock chamber 8, a sample chamber 9, an electron microscope lens unit 50 and a load port 4. In addition, among two load ports shown in FIG. 1 as an example, one is used as a stocker 6 capable of holding a plurality of photomasks 17 and describes a configuration capable of taking out the photomask 17 from the stocker 6 as required. A mask conveying robot 2 takes out the photomask 17 from the stocker 6 or an SMIF pod 5 disposed on the load port 4 to then convey to the load lock chamber 8. The load lock chamber 8 provides mask holders 52, and the mask conveying robot 2 loads the photomask 17 on the mask holder 52.

The mask holder 52 is conveyed into the sample chamber 9 by a transport mechanism, which is not shown, to be loaded on a sample stage 51. In addition, a description will be concerned with an example of transporting the photomask 17 between the sample chamber 9 and load lock chamber 8 by using the mask holder 52, in this embodiment. However, this is not limited thereto. For example, the photomask 17 may be conveyed, without using the holder, by using another conveying mechanism such as a robot hand etc.

On an operation of a device regarding the CD-SEM, the sample chamber 9 is set in a condition where a high vacuum is maintained constantly. On an introduction of the photomask 17 into the sample chamber 9, the inside of load lock chamber 8 is preliminarily evacuated, and a gate valve installed between the sample chamber 9 and load lock chamber 8 is opened to introduce the photomask 17 into the sample chamber 9 when a vacuum atmosphere in the load lock chamber 8 is equivalent to the sample chamber 9. In addition, FIG. 1 is a top view of the CD-SEM. FIG. 2 is a view of the CD-SEM seen from the side of stocker 6 and load port 4. FIG. 3 is a side view of the CD-SEM.

Figure 4:
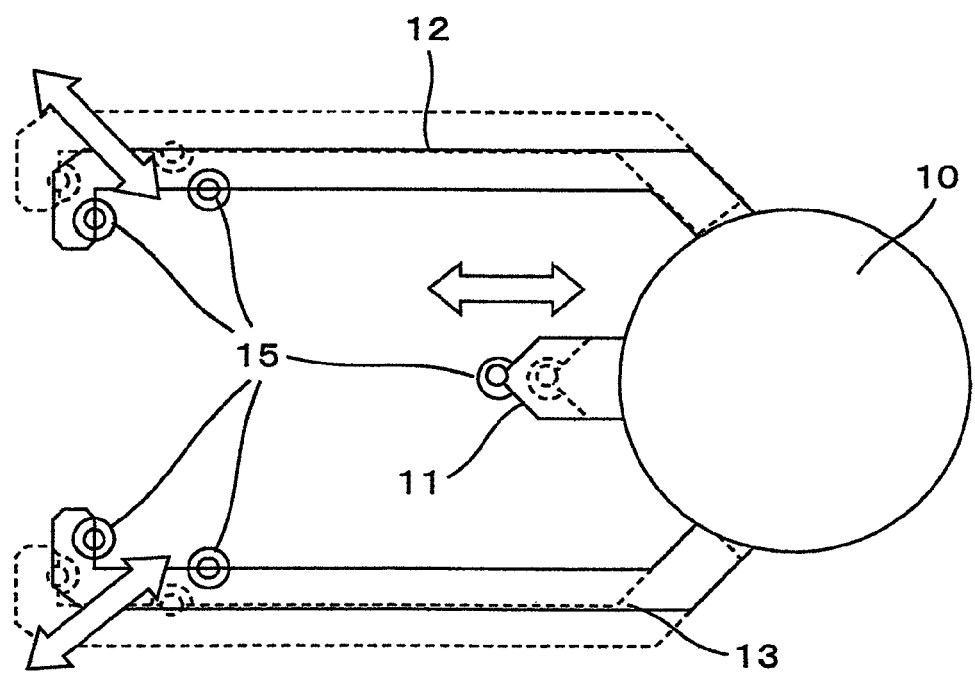
FIG. 4 is a view for explaining an operation of a mask clamp mechanism unit.

The mask conveying robot 2 provides a mask clamp mechanism unit 3. Next, the mask clamp mechanism unit 3 will be described in detail with reference to FIG. 4 to FIG. 7. FIG. 4 is a view for explaining an operation of the mask clamp mechanism unit 3, which is a top view of the mask clamp mechanism unit 3. The mask clamp mechanism 3 provides a driving mechanism 10 for driving a pair of arms 12, 13 and a center arm 11 in respective arrow directions. The lower portion of the pair of arms 12, 13 provides suspending sections 15 for supporting such that the photomask 17 is suspended.

Figure 7:
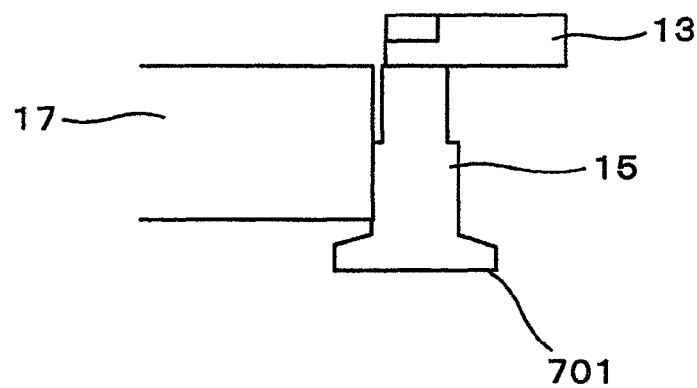
FIG. 7 is a view for explaining an outline for photomask suspending sections of the mask clamp mechanism.

The suspending section 15 provides a flange 701 on a lowermost portion thereof as shown in FIG. 7, and the photomask 17 is supported by the suspending sections 15 such that the lower portion (surface where there is no pattern) of photomask 17 is faced to the flange 701. FIG. 7 is an enlarged side view of proximity to the suspending section 15. As shown in FIG. 7, the suspending section 15 provides the flange 701 projected relatively in the direction of photomask 17 in comparison to other portions of the suspending section 15. Further, an upper side portion from the flange 701 of the suspending section 15 is formed such that a portion located at a surface (pattern surface) side of the photomask 17 is separated from the back surface side (lower portion) of photomask 17. That is, the upper side thereof is formed such that it becomes relatively thinner compared with the lower side of suspending section 15.

Further, the arms 12, 13 and center arm 11 support the suspending sections 15 such that they are separated relatively more from the photomask 17 than the suspending sections 15.

As mentioned above, the upper side of suspending sections 15, and arms are configured such that they are separated relatively from the photomask 17 in comparison to the lower side of suspending sections 15, therefore, it is possible to inhibit a damage to a pattern surface when the suspending sections 15 etc. contact to the photomask 17, even though the photomask 17 is loaded obliquely on the mask holder 52 by causing some sort of condition. When the sample is loaded obliquely, there is a possibility that the edge portion of pattern surface is bumped against the suspending sections 15 contacted to the side portion of photomask 17. However, according to the above-mentioned configuration, it is possible to minimize a risk of damage to be imparted to the pattern surface since a clearance space can be secured on the sample which is inclined.

Further, the photomask 17 is a sheet-like body having a rectangle or square, and it is desirable that all of sides (four sides) of the rectangle or square are supported so that the photomask 17 is supported stably. In the example shown in FIG. 4 etc., the four sides are supported by using five suspending sections 15. Further, the five suspending sections 15 are supported by the center arm 11 and arms 12, 13, and they are moved linearly in the arrow directions, respectively, by a driving device incorporated in the driving mechanism 10. According to the above-mentioned configuration, it is possible to minimize the risk of sample damage caused by bumping of the flange 701 on the sample which is inclined etc. or the risk thereof caused by a friction between the back surface of photomask 17 and the flange 701. This reason is described below.

Firstly, the arms 12, 13 provide two suspending sections 15, respectively, on the lower portion thereof. The arms 12, 13 move linearly (move in a direction parallel to the pattern surface in the case where the photomask 17 is loaded normally) by the driving mechanism to contact the two suspending sections 15 to the photomask 17 such that the two suspending sections 15 provided respectively on the arms 12, 13 support different sides of the photomask 17. With the movement of the arms 12, 13, the center arm 11 is moved toward the photomask 17 such that the suspending section 15 provided on the center arm 11 is contacted to the photomask 17. In response to this movement, total five flanges 701 are positioned at below the photomask 17.

When the suspending sections 15 supporting the different two sides are moved by using one arm (arm 12 or 13), the following configuration can be considered such that: firstly, the arm 12 is moved along a longitudinal direction of the arm 12; secondly, the arm 12 is moved in a direction parallel to the pattern surface of photomask 17 or a perpendicular direction to the longitudinal direction of the arm 12; and thirdly, the arm 12 is moved from an oblique direction with regard to the sides configuring the photomask 17, as shown in FIG. 4.

Among the above-mentioned three configuration examples, according to the third configuration, it is possible to minimize a moving distance of the flange 701 after the flange 701 is contacted to the side portion or back surface of the photomask 17. In the case of the first and second configurations, after one flange is contacted to the photomask 17 among the two flanges 701 provided on the arm 12, there arises a problem that the distance of movement with the photomask 17 contacting to the flange becomes long. That is, either one of the flanges 701 supported by the arm 12 is moved along the side of photomask 17 opposed to the flange. However, in this case, when the photomask 17 is loaded obliquely, there is a possibility that the flange 701 moves with the photomask 17 contacted to the flange 701 and the flange 701 presses the side portion of photomask 17 to continue such conditions throughout the time of the movement of arm 12 afterward.

In contrast, according to the third configuration, the arm 12 is driven in one direction to be able to position the two suspending sections 15 with respect to the two sides. Further, even when the two flanges 701 providing on the two suspending sections 15 are contacted to the photomask 17, the moving distance after contacting can be made small. Particularly, the moving distance, after contacting the flange 701 with the photomask 17, can be minimized if the moving direction of arms 12, 13 is set such that the moving direction of arm 12 is set to a 45 degrees direction with respect to the two sides of photomask 17. In addition, in this embodiment, a description will be concerned with an example where the two suspending sections 15 (a second suspending section and a third suspending section, and a fourth suspending section and a fifth suspending section) are provided respectively on the arms 12, 13 and one suspending section (first suspending section) is provided on the center arm 11, which is however not limited thereto. It is possible to provide six or more suspending sections.

As mentioned above, the driving device is configured such that one arm operation performs to support the two sides, so that plural sides can be supported by a simple configuration. According to the above-mentioned third configuration, by the driving device for performing three linear movements, all of four sides of the rectangular photomask can be supported by the suspending sections 15. Therefore, it is possible to inhibit the risk of damage to be imparted to the sample even on a contact of bare possibility.

Figure 5:
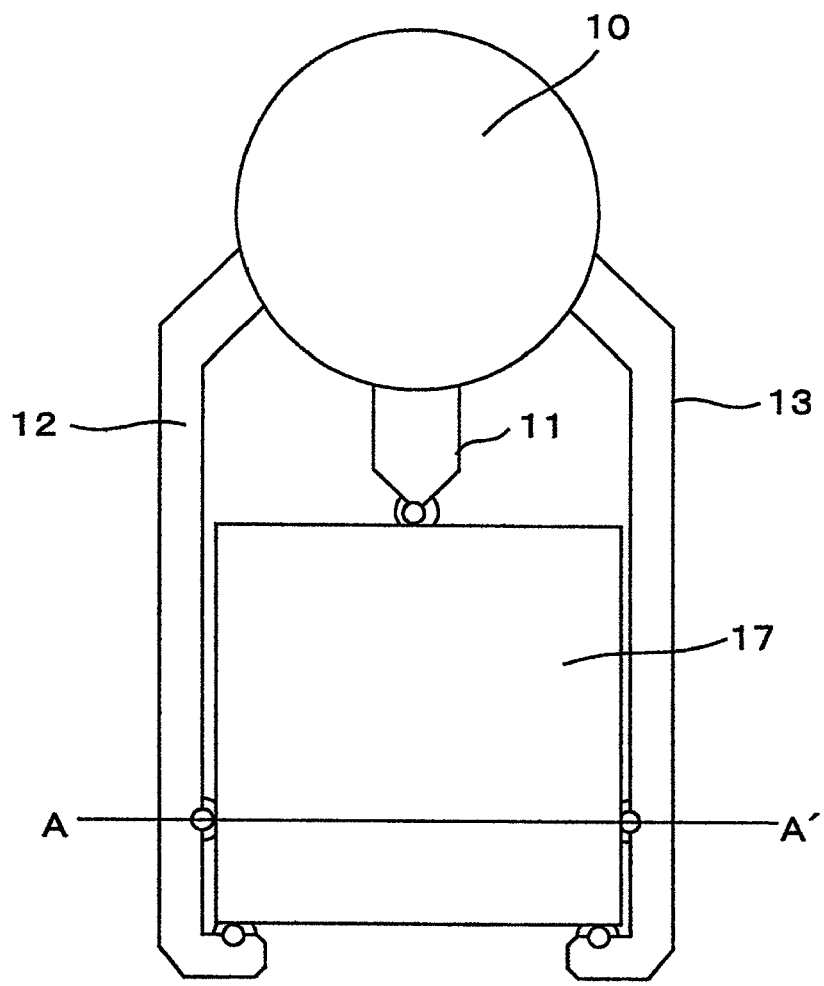
FIG. 5 is a top view of the mask clamp mechanism unit.
Figure 6:
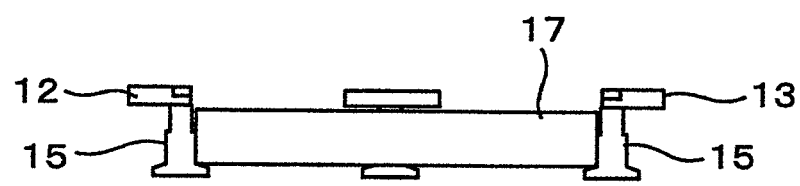
FIG. 6 is a sectional view of the mask clamp mechanism.

FIG. 5 is a top view of a condition where the photomask 17 is held by the mask clamp mechanism unit 3. FIG. 6 is a sectional view indicated by A-A' in FIG. 5.

Figure 8:
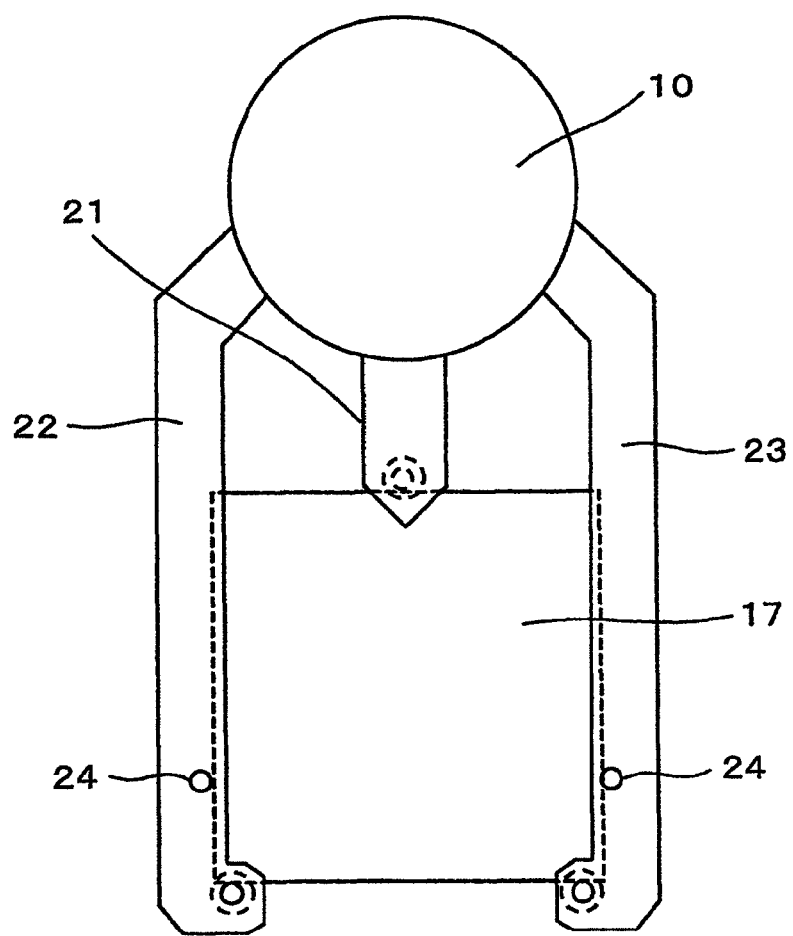
FIG. 8 is a top view of the mask clamp mechanism unit having arms formed so as to cover a part of the photomask.
Figure 9:
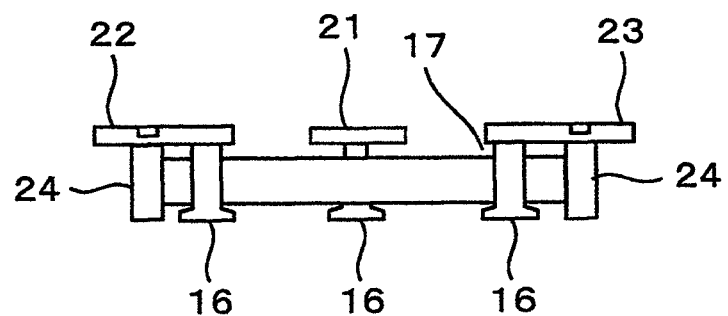
FIG. 9 is a front view of the mask clamp mechanism unit having the arms formed so as to cover a part of the photomask.
Figure 10:
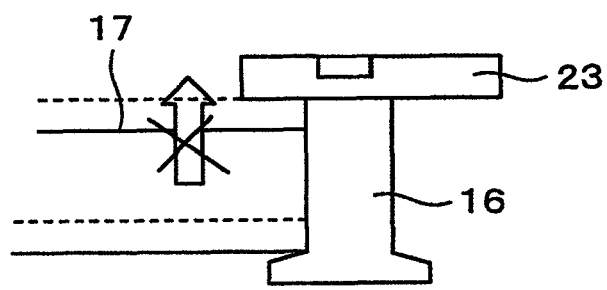
FIG. 10 is a view for explaining a contact condition between the arms and photomask.

FIG. 8 is a view for explaining the mask clamp mechanism having a structure where an arm 23 is projected to the side of photomask 17 by suspending sections (2) 16. In the mask clamp mechanism in FIG. 8, the side portion of suspending sections (2) 16 is formed linearly, and the arm 23 is formed such that it is projected to the side of photomask 17. In the mask clamp mechanism shown in FIG. 8 and FIG. 9, there is a possibility that a surface end portion (edge portion of the pattern surface) of the photomask 17 is contacted to the lower surface of arm 23 and the side surface of suspending sections (2) 16 on the sample which is held, when the photomask 17 is loaded obliquely. Specifically, as shown in FIG. 10, there is a possibility that the pattern surface of photomask 17 is contacted to other members when a part of the edge portions of photomask 17 is placed and relatively lifted in comparison with other portions, caused by the sample loaded obliquely. According to the configuration shown in FIG. 4 to FIG. 7, it is possible to inhibit the risk of contact between the pattern surface and the other members even in a condition where the photomask 17 is lifted as shown in FIG. 10.

Figure 12:
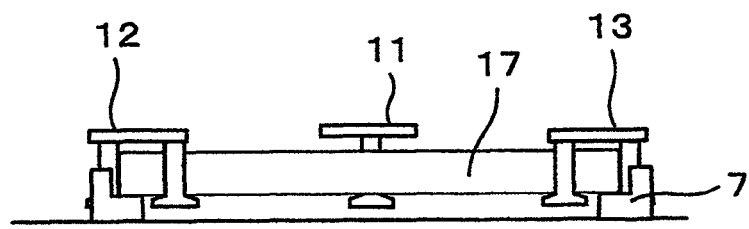
FIG. 12 is a view showing a condition where the photomask loaded on mask loading steps is held by the mask clamp mechanism.
Figure 13:
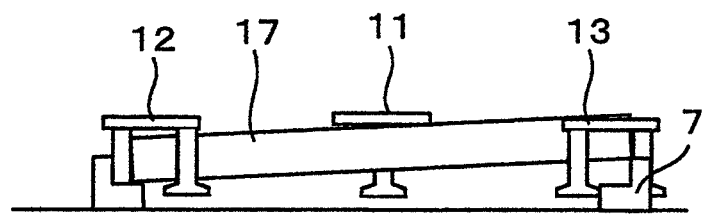
FIG. 13 is a view showing a condition where the photomask 17 is loaded obliquely on the mask loading steps.
Figure 14:
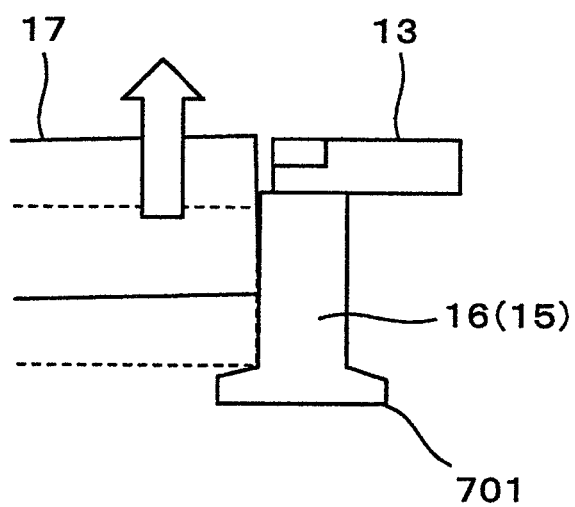
FIG. 14 is an enlarge view of the suspending section in the mask clamp mechanism.

Further, FIG. 11 to FIG. 14 show other embodiments of the mask clamp mechanism. As shown in FIG. 14, the side portion of suspending section (2) 16 is formed linearly along the side portion of photomask 17, however, the arm 23 is relatively separated from the suspending section (2) 16 seen from the photomask 17. The suspending section (2) 16 is fixed to an arm 14. Even in the above-mentioned configuration, it is possible to inhibit the risk of contact between the pattern surface of photomask 17 and the other members.

Whether the configuration is set to FIG. 7 or FIG. 14, it should be determined on the basis of a relation between a size of configuration elements configuring the mask clamp mechanism and a thickness etc. of the photomask 17. For example, among the suspending sections 15, when a size of upper side portion from the flange 701 in a vertical direction is small compared with the thickness of photomask 17 or when the pattern surface of photomask 17 is projected to the upper side from a top surface of suspending section 15 as a condition (condition shown in FIG. 14) on the sample which is inclined, the possibility of contact between the pattern surface edge portion of photomask 17 and the side portion of suspending section 15 is extremely low, and thereby it can be configured that the arm 13 is selectively separated from the photomask 17.

Figure 11:
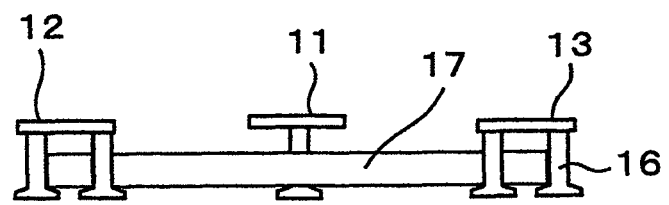
FIG. 11 is a front view of the mask clamp mechanism in a condition where the photomask is suspended.

In contrast, it is desirable that an uneven portion is formed on the suspending section 15 so as to separate the upper portion of suspending section 15 from the photomask 17, as shown in FIG. 7, when predicting the contact risk between the suspending section 15 and the pattern surface end portion of the photomask 17. FIG. 11 is a front view of the mask clamp mechanism in a condition where the photomask 17 is suspended. FIG. 12 is a view showing a condition where the photomask 7 loaded on mask loading steps 7 is held by the mask clamp mechanism. FIG. 13 is a view showing a condition (abnormal seating condition) where the photomask 17 is loaded obliquely on the mask loading steps 7. FIG. 14 is an enlarged view of proximity to the suspending section 15 in the mask clamp mechanism and showing a condition (the photomask 17 indicated by a solid line shows the abnormal seating condition and a dotted line shows the normal seating condition) where the photomask is intended to be held on the abnormal seating.

The mask loading steps 7 are provided on the mask holder 52 or other places on which the photomask 17 is loaded, and the mask clamp mechanism conveys the photomask 17 loaded on the mask holder 52. The suspending sections 15, center arm 11, arm 12 and arm 13 are disposed on such that they are not contacted to the mask loading steps 7 etc. when holding the photomask 17. The mask clamp mechanism moves such that the flange 701 is positioned at the lower portion of photomask 17 loaded on the mask loading steps 7 by retracting the center arm 11 toward the driving mechanism 10 and extending the arms 12, 13 from the driving mechanism 10. After that movement, all of the three arms are moved to the side of photomask 17 to hold the photomask 17.

There is a possibility that the photomask 17 is contacted to the arms 12, 13, suspending sections 15, etc. when the photomask 17 is loaded obliquely at a time of holding the photomask 17, however it is possible to inhibit the risk of contact afterward, according to the configuration illustrated in FIG. 7 and FIG. 14.

Figure 15:
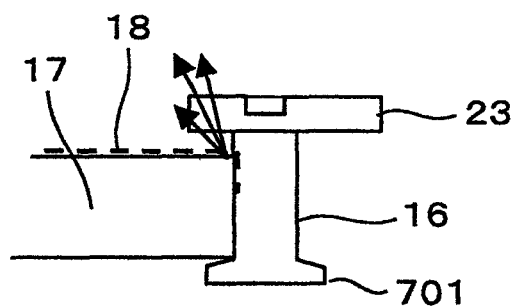
FIG. 15 is a view for explaining a condition where a reticle applied to the suspending section and the photomask is contacted.
Figure 16:
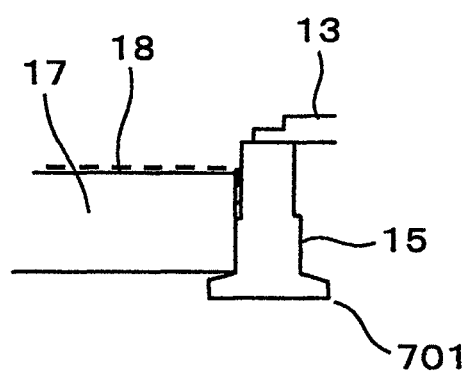
FIG. 16 is a view for explaining the suspending section capable of a non-contact condition from the reticle by separating a part of the suspending section from the photomask.

FIG. 15 and FIG. 16 are views for explaining more specifically a technical advantageous effect on the basis of configuration example of the mask clamp mechanism shown in FIG. 7 etc. The photomask 17 is sometimes applied with a photoresist 18. The photoresist 18 is applied to not only the top surface of photomask 17 but also a top half of side surface thereof. Particularly, a top surface edge portion (corner portion) of photomask 17 has a bump of the photoresist.

As mentioned above, in a condition where the photoresist 18 covers over the photomask 17, when the suspending sections (2) 16 are contacted to the photomask 17 so that the photomask 17 is held, according to the suspending section (2) 16 shown in FIG. 15, the bump of the photoresist 18 is contacted to the suspending section (2) 16 to sometimes fly the photoresist apart. The photoresist 18, which is flied apart, is adhered on the top surface of photomask 17 as a foreign substance. The adhered foreign substance remains as a defect, therefore, there is a possibility to cause the photomask to reduce a process yield. For a purpose of eliminating such contact possibility, the suspending section 15 is employed as shown in FIG. 7. Thereby, it is possible to eliminate the contact between the photoresist 18 and suspending sections 15 as shown in FIG. 16.

In addition, in consideration such that the photoresist 18 applied to the photomask 17 is applied to as far as the top half of the side surface of photomask 17, an uneven portion is formed on the suspending section 15 such that the suspending section 15 is contacted selectively to a bottom half of the side surface of photomask 17, in a condition where the lower side corner portion of photomask 17 is contacted to the flange 701. A distance of a contact portion between the suspending section 15 and photomask 17 in a height direction is set to an equal to or less than half thickness of the photomask 17 from an origin at the inner side end portion of flange 701.

According to the configuration mentioned above, it is possible to provide the mask clamp mechanism capable of inhibiting the movement in a side direction (surface direction of photomask 17) of the photomask 17 without peeling off the photoresist from the sample applied with the photoresist.

Next, the charged particle beam device will be described with reference to the drawings in which it provides a mechanism for removing a charge adhered on the photomask 17 on the conveying of photomask 17 by the mask clamp mechanism. In recent years, a semiconductor sample has sometimes been conveyed to a measurement/inspection device of the SEM etc. with the charge adhered thereto in that manufacturing process. Since it is caused that such charge is effect on a focus condition etc. of an electron beam and a focus adjustment becomes difficult when measuring and inspecting in the SEM, US patent bulletin U.S. Pat. No. 6,507,474 has proposed a technique for removing electricity to eliminate the charge by using a removing electricity mechanism made up of an ionizer on the conveying of the sample.

However, U.S. Pat. No. 6,507,474 does not refer to how the conveying mechanism is configured. For example, if the conveying mechanism is configured to support the sample from below as described in the Patent Literature 1, a support member is intervened between the sample and ionizer. Therefore, there arises a problem such that the removing electricity for a place where is shielded by the ionizer cannot be performed sufficiently. Particularly, when the charge is removed from all over the sample area, which has been performed in recent years, the focus adjustment becomes sometimes more difficult since the removing electricity effect is varied dependent on a place on the sample.

Figure 17:
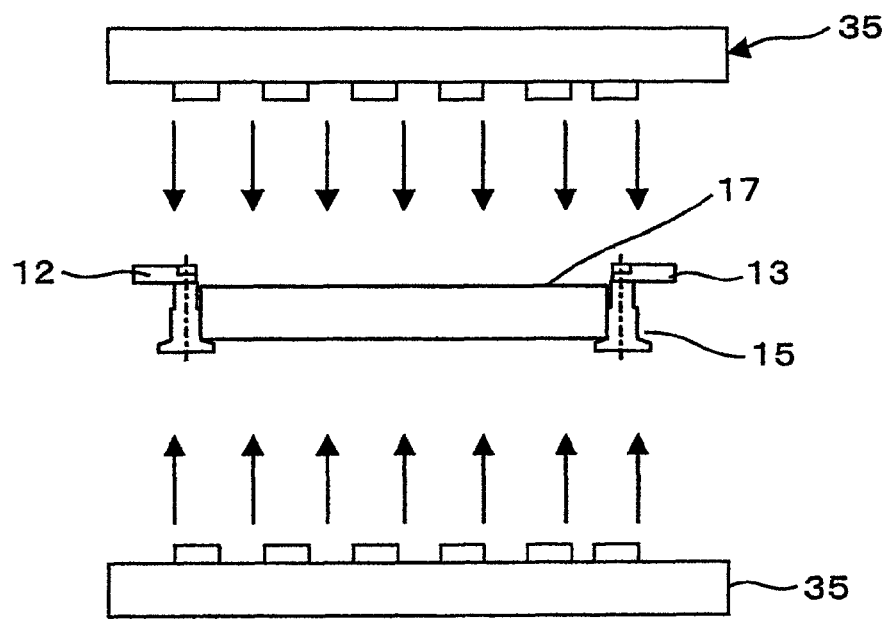
FIG. 17 is a view for explaining an example of removing electricity from the photomask held on the mask clamp mechanism by using an ionizer.

According to the mask clamp mechanism shown in FIG. 17, in out of a conveying trajectory of the photomask 17, since a member for shielding between an ionizer 35 disposed on the top and bottom of conveying trajectory and a moving trajectory can be made minimized, it is possible to maximize the removing electricity effect by the ionizer. Particularly, in the photomask, the back surface covered by a quartz sample has sometimes a greater adhered amount of the charge than that of the surface formed of a light shield pattern made up of chromium. Since a part of the five flanges 701 is only intervened between the ionizer 35 and the back surface of photomask 17, it is possible to uniformly remove electricity from a substantially entire back surface of the photomask 17.

Figure 18:
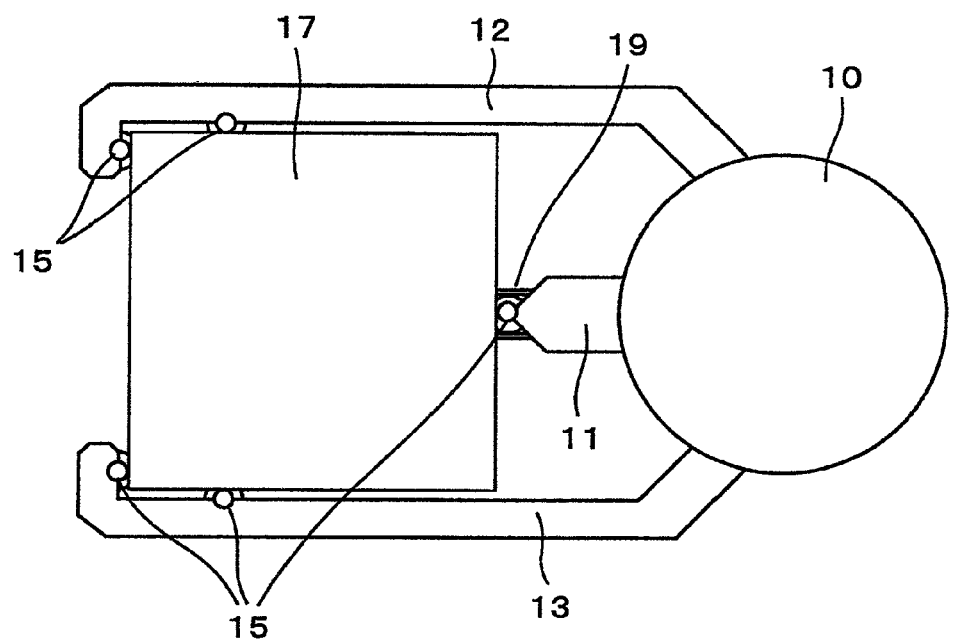
FIG. 18 is a view for explaining the mask clamp mechanism providing a protection fixture.
Figure 18:
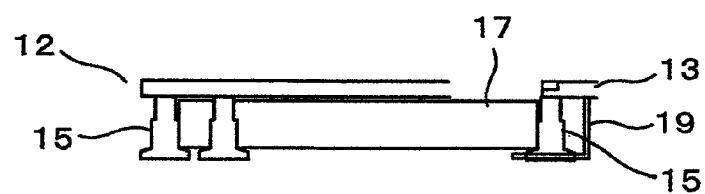

FIG. 18 is a view for explaining an example further provided a protection fixture 19 on the mask clamp mechanism shown in FIG. 5. The protection fixture 19 has a structure further projected toward the side of photomask 17 from the flange 701 to be able to further inhibit the risk of dropping the photomask 17. Further, since the side end of photomask 17 on the protection fixture 19 has a structure of such that it is positioned at the lower portion than the flange 701, the contact risk between the protection fixture 19 and photomask 17 can be reduced even in the case where the photomask 17 is loaded obliquely.

REFERENCE SIGNS LIST

1 Sample transport mechanism of the mini-environment type
2 Mask conveying robot
3 Mask claim mechanism unit
4 Load port
5 SMIF pod
6 Stocker
8 Load lock chamber
9 Sample chamber
10 Driving mechanism
11 Center arm
12, 13, 22, 23 Arm
15 Suspending sections
16 Suspending sections (2)
17 Photomask
18 Photoresist
19 Protection fixture
21 Center arm
24 Clamp guide
35 Ionizer
50 Electron microscope lens unit
51 On the sample stage
52 Mask holder
701 Flange

The invention claimed is:

1. A sample conveying system, comprising:
   a sample having a pattern surface;
   a transport mechanism; and
   a sample retention mechanism, coupled to the transport mechanism, for holding the sample, the sample retention mechanism including:
     a pair of arms having a plurality of stepped, suspending sections depending therefrom, each suspending section having an upper portion and a lower portion, the upper portion having a height that is the same as or greater than a height of the pattern surface of the sample, and
     a driving section to move the pair of arms such that the suspending sections are close to or are separated from the sample,
   wherein, when the suspending sections are close to the sample, the lower portions contact the sample and the upper portions do not contact the sample.

2. The sample conveying, system according to claim 1, further comprising a center arm having a suspending section for supporting a side of the sample other than the sides of the sample supported by the pair of arms.

3. The sample conveying system according to claim 1, wherein the suspending section lower portion has a flange for positioning below the sample.

4. The sample conveying system according to claim 1, wherein a distance between a side portion of the sample and a contact portion of the suspending portion in a height direction is an equal to or less than a half thickness of the sample.

5. A sample conveying mechanism that holds and conveys a sample having a pattern surface on a surface thereof, the sample conveying mechanism comprising:
    a transport mechanism; and
    a sample retention mechanism, transported by the transport mechanism, for holding the sample, the sample retention mechanism including:
        a center arm, having a first suspending section depending therefrom, to support a side of the sample,
        a first arm, having a second suspending section and a third suspending section depending therefrom, to support respectively an opposite side to the side supported by the first suspending section and a side adjacent to the opposite side,
        a second arm, having a fourth suspending section and a fifth suspending section depending therefrom, to support respectively the opposite side to the side supported by the first suspending section and an opposite side to the side supported by the third suspending section, and
        a driving section to move the center, first and second arms such that the suspending sections come close to or are separated from the sample,
    wherein each suspending section has an upper portion and a lower portion, and, when the suspending sections are close to the sample, the lower portions contact the sample and the upper portions do not contact the sample.

6. The sample conveying mechanism according to claim 5, wherein the driving section moves the second and third suspending sections and the fourth and fifth suspending sections in a direction parallel to the pattern surface or an oblique direction with respect to the respective sides.

7. The sample conveying mechanism according to claim 6, wherein the driving section moves the second, third, fourth and fifth suspending sections in a 45 degrees direction with respect to the respective sides.

8. A sample conveying mechanism comprising a retention mechanism for holding a photomask having a rectangular, sheet-like body with a pattern surface and four sides, the retention mechanism comprising:
    a pair of arms, each having two or more suspending sections depending therefrom, for supporting the photomask on three sides;
    a center arm, having one or more suspending sections depending therefrom, for supporting the photomask on a side other than the three sides supported by the suspending sections provided on the pair of arms; and
    a driving section that moves the center arm and the pair of arms in a direction parallel to the pattern surface, and that moves the pair of arms in an oblique direction with respect to respective sides of the body.

9. The sample conveying mechanism according to claim 8, wherein the driving section moves the suspending sections provided on the pair of arms in a 45 degrees direction with respect to the respective sides of the photomask.

* * * * *